United States Patent [19]

Loesch

[11] 4,229,691

[45] Oct. 21, 1980

[54] ELECTRICAL TESTING OF CORDS TERMINATED WITH MODULAR PLUGS

[75] Inventor: Robert P. Loesch, Omaha, Nebr.

[73] Assignee: Western Electric Company, Inc., New York, N.Y.

[21] Appl. No.: 972,632

[22] Filed: Dec. 22, 1978

[51] Int. Cl.³ ............................................. G01R 31/02
[52] U.S. Cl. ................................... 324/51; 324/73 R
[58] Field of Search ............................. 324/51, 73 R Primary Examiner—Michael J. Tokar
Attorney, Agent, or Firm—E. W. Somers

[57] ABSTRACT

Telephone cords (13—13) which are terminated with modular plugs (11—11) having an array of spaced blade-like terminals (17—17) are tested for continuity and for test voltage breakdown by simultaneously engaging the terminals in the plug at each end of the cord with an array of spaced test probes (30—30) in which adjacent probes are staggered along the lengths of the terminals. In a four conductor cord, alternating ones of the terminals at each end of the cord are engaged by test probes which connect the terminals in an isolated series loop of a test circuit (40) in which a first one (41) of the loops is connected to a secondary winding (86) of a test voltage input transformer (85) with the secondary winding also being connected through a primary winding (91) of an output detector transformer (90) and then to a second one (60) of the loops. Should a breakdown between adjacent terminals occur, which is manifested by a breakdown between loops when a test voltage is impressed thereacross, a voltage is caused to be applied across the secondary winding (95) of the detector transformer (90) to cause an output which is indicative of a defective cord.

16 Claims, 10 Drawing Figures

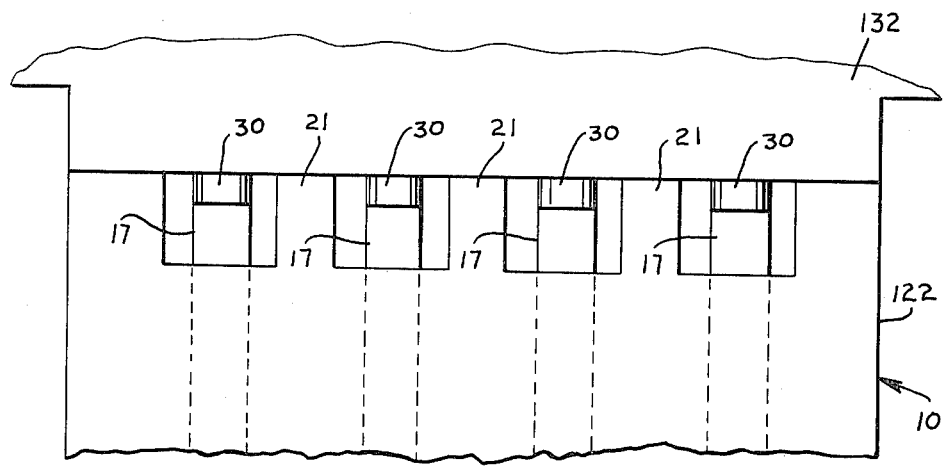
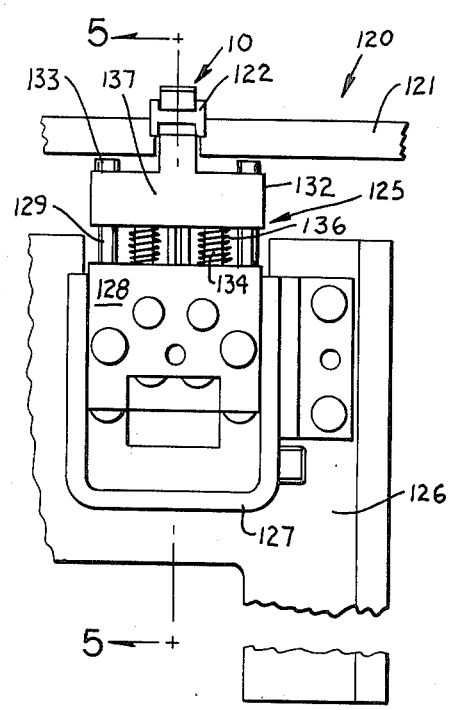
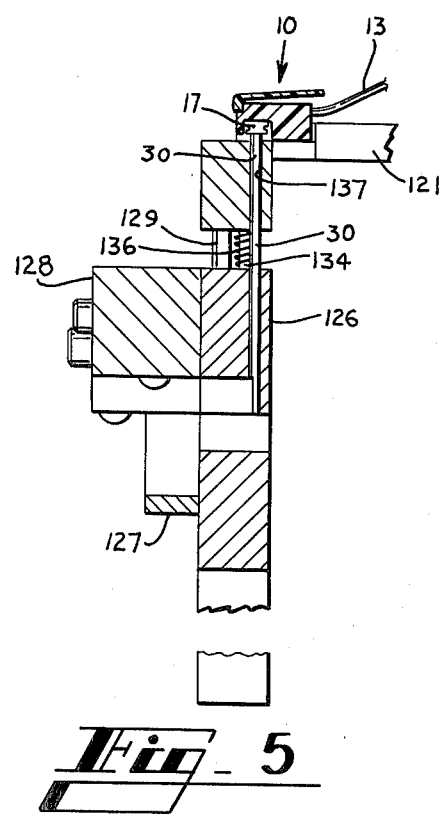

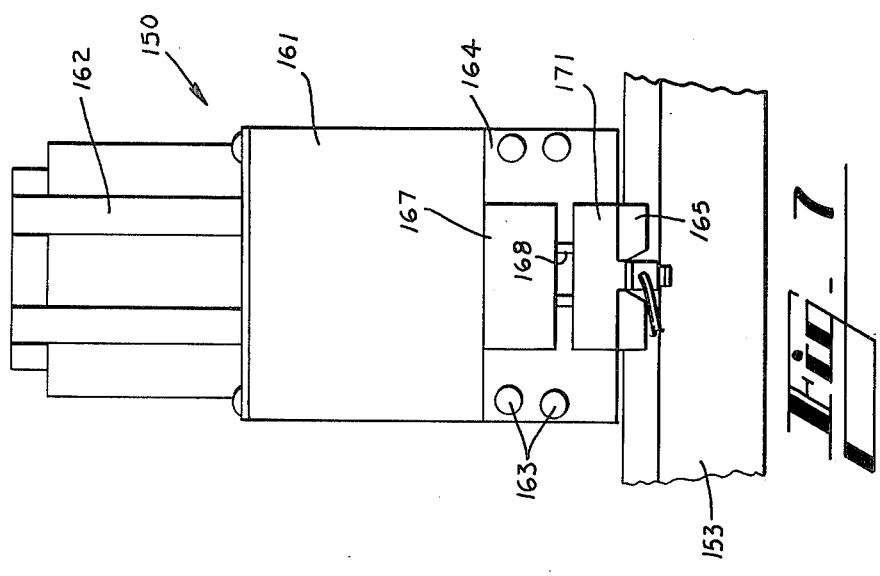
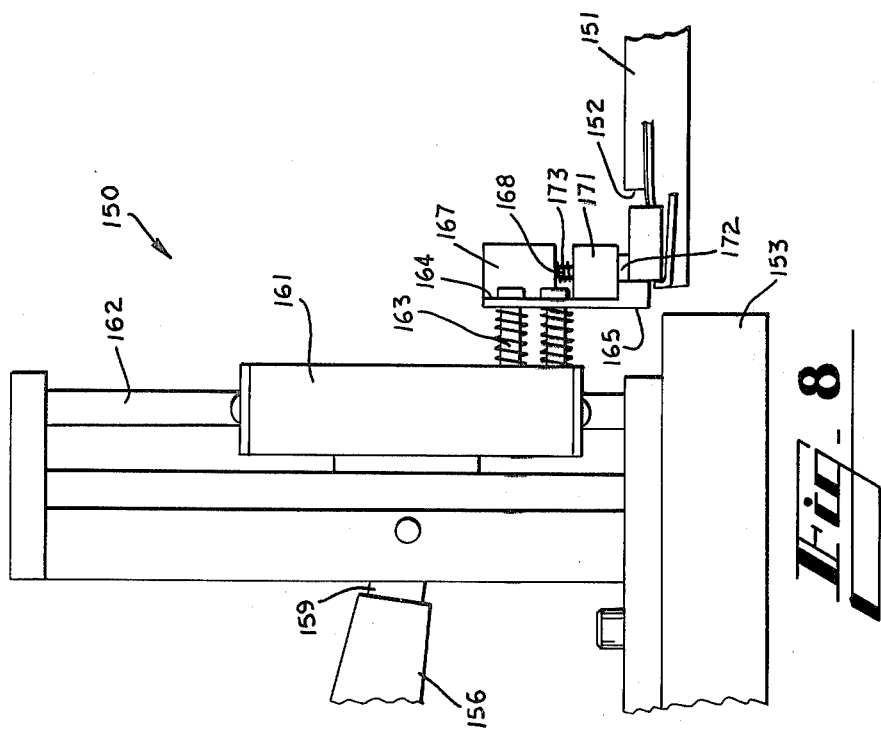

ELECTRICAL TESTING OF CORDS TERMINATED WITH MODULAR PLUGS

TECHNICAL FIELD

This invention relates to methods of and apparatus for the electrical testing of cords terminated with modular plugs, and, more particularly, to methods of and apparatus for continuity and relatively high voltage breakdown testing of modular plugs, which are used in telephone sets.

BACKGROUND OF THE INVENTION

A telephone handset and base, as well as the base and a wall terminal, are typically interconnected by a telephone cord which is terminated at each end by a modular plug. The modular plugs are inserted into jacks in the base, the handset, and in the wall terminal. Modular plugs are known in the art and are covered by patents such as E. C. Hardesty et al U.S. Pat. No. 3,699,498 which issued Oct. 17, 1972. Telephone cords that are mass produced in a factory environment and terminated with modular plugs, which include a plurality of spaced, parallel terminals in the shape of blades, must be checked for electrical continuity and must be tested for breakdown when they are subjected to a relatively high test voltage of about 1000 volts.

It has been customary to use an apparatus which tests the cord for electrical continuity from one end to the other and then tests for high voltage breakdown. This is generally accomplished with a test set which includes a plurality of relays with contacts being shifted by precise sequential timing devices for testing each successive conductor and for switching from a continuity test mode to a voltage breakdown test mode. In one commonly used apparatus for testing telephone cords, each conductor in sequence is tested for voltage breakdown by impressing a test potential between one conductor and the other conductors which are grounded.

It is difficult to achieve consistently reliable tests over a substantially long period of time with test sets including switching circuits that require precise sequential timing and including relays which have a high frequency of maintenance, especially when used in relatively high voltage circuits. Moreover, when such a test set is controlled to disconnect the continuity test mode and to reconnect to a voltage test mode, there is no guarantee that the cord conductors will be connected to the test voltage because of the possibility of the relay contacts sticking together, which could cause an erroneous indication of the quality of the cord.

The commonly used high voltage breakdown test apparatus includes a plurality of test probes which are adapted to engage the terminals and which are spaced apart in a linear array on centers aligned with the array of spaced, parallel terminals. Quite often in this arrangement, because the terminals may be spaced as close as about 0.10 cm on centers, an arcing occurs between adjacent ones of the test connections which gives a fallacious reading in the test set insofar as voltage breakdown testing is concerned. It would be most desirable to provide a test set for use in a manufacturing environment in which the voltage breakdown testing of plug-terminated cords could be made with confidence in the results and with the same test set which tests for continuity.

Unfortunately, apparently no test apparatus which overcomes the foregoing problems exists in the prior art. The known prior art does include U.S. Pat. No. 3,354,389 which shows an apparatus for testing a plurality of conductors for continuity and shorts, and for voltage breakdown between each successive conductor and the remaining conductors which are grounded by causing appropriate relays to be operated. Another patent, U.S. Pat. No. 3,600,673, relates to a sequentially stepped, multiconductor testing apparatus having switches for connecting high and low voltage currents to circuits under test.

Seemingly, the prior art is devoid of apparatus that provides a solution to the problem of the reliable testing of cords, which are terminated with modular plugs, for continuity and test voltage breakdown, and that advantageously includes elements having a low frequency of maintenance.

SUMMARY OF THE INVENTION

The foregoing problems of the prior art have been overcome by this invention which includes methods and apparatus for testing cords which are terminated with modular plugs and which include conductors connected to terminals that are mounted in the plug for continuity and test voltage breakdown. In accordance with the invention, a method of testing electrical conductors includes the steps of establishing a first series loop which includes one of the conductors and establishing a second loop which is isolated from the first loop and which includes another one of the conductors which is adjacent the one conductor that is included in the first loop. Then, one end of the secondary winding of a test voltage source transformer is connected to the first loop and the other end of the same winding to one end of the primary winding of a detector transformer which has its other end connected to the second loop. By this sequence of steps, should a voltage breakdown occur between the loops when a test voltage is impressed across the source transformer and between the conductor in the first loop and the conductor in the second loop, current flows through the primary winding of the detector transformer to provide an output reading which is indicative of a breakdown between said adjacent conductors.

In the testing of the plug and conductors of a four conductor cord which are disposed in a linear array, test probes are moved into engagement with alternate ones of the terminals at each end of the cord as each cord is moved into a test station. Probes at each end which engage alternate terminals are connected into a first loop that extends between a secondary of a low voltage transformer and through a primary winding of a step-up transformer for detecting continuity. The remaining two terminals at each end are connected through probes into a second series loop which extends from a secondary of another input transformer through a primary winding of a continuity detector transformer. Simultaneously with the continuity testing of the first and second loops, breakdown test potential is applied across the two loops with breakdown between any two conductors causing current to flow through a breakdown detector transformer and provide an indication of a breakdown.

BRIEF DESCRIPTION OF THE DRAWING

Other features of the present invention will be more readily understood from the following detailed description of specific embodiments thereof when read in conjunction with the accompanying drawings, in which:

FIG. 4 is a front elevational view of a portion of an apparatus which is used to hold a telephone cord which has been terminated at each end with a modular plug for tests by probes which are brought into engagement with the terminals of the plug;

FIG. 5 is a side elevational view partially in section of the apparatus shown in FIG. 4;

FIG. 6 is a detailed inverted view showing the engagement of the test probes in FIG. 4 with the terminals of a modular plug in a manner which avoids inadvertent breakdown between adjacent ones of the terminals;

FIG. 7 is a front elevational view of an alternate embodiment of an apparatus which is used to test modular plugs;

FIG. 8 is a side elevational view of the apparatus shown in FIG. 7; and

DETAILED DESCRIPTION

Figure 1:
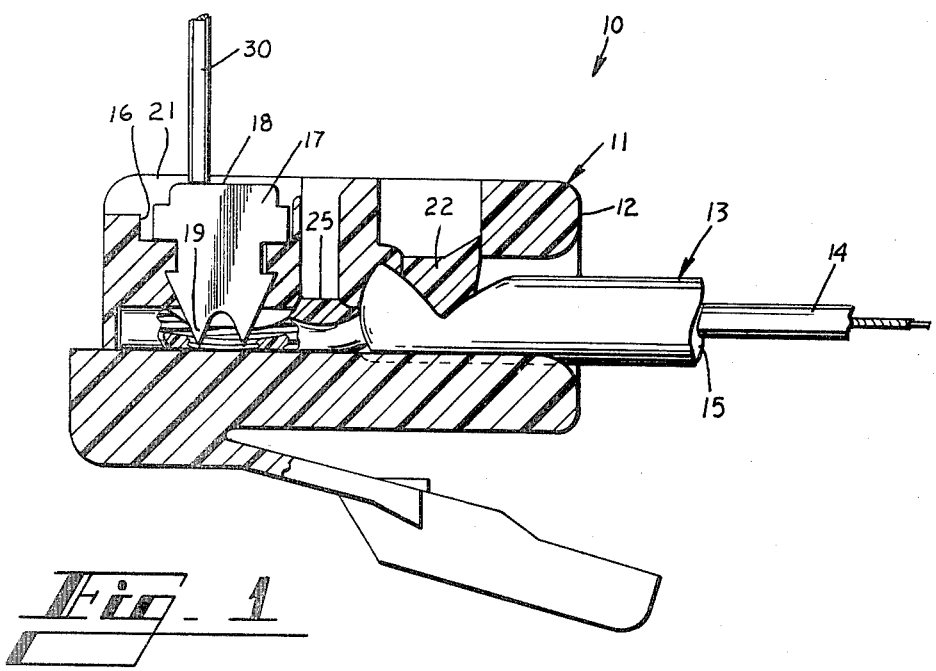
FIG. 1 is an elevational view partially in section of a modular plug which currently enjoys wide use in the telephone industry and showing one of a plurality of blade-like terminals which are connected electrically to associated conductors of either a line or retractile telephone cord.

Viewing now FIG. 1, there is shown a modular plug, designated generally by numeral 10, which is well known in the art and which is shown, for example, in U.S. Pat. No. 3,860,316 issued Jan. 14, 1975 in the name of E. C. Hardesty. The modular plug 10 generally includes a unipartite housing 11 made of a plastic material and having a cord-input end 12 for receiving one end of a telephone cord 13 having a plurality of individually insulated tinsel conductors 14—14 enclosed in a jacket 15. The plug 10 further includes openings 16—16 adjacent a front end thereof for receiving spaced, individual terminals 17—17, each of which has an outwardly facing contact edge 18 and inwardly facing tangs 19—19 which engage associated ones of the cord conductors. Each of the terminals 17—17 is about 0.35 cm in length, about 0.41 cm in height and about 0.03 cm in thickness. The terminals 17—17 are held within the plug housing 11 on centers of about 0.10 cm in individual compartments, which advantageously are designed to prevent breakdown during use, with the outwardly facing contact edges 18—18 being separated by fins 21—21. A strain relief member 22 which is moved pivotally into engagement with the cord jacket anchors the cord within the plug housing 11, while the individual conductors 14—14 are anchored by a moveable portion 25 which is moved into engagement with the conductors of a length of the cord from which the jacket 15 has been removed.

Figure 2:
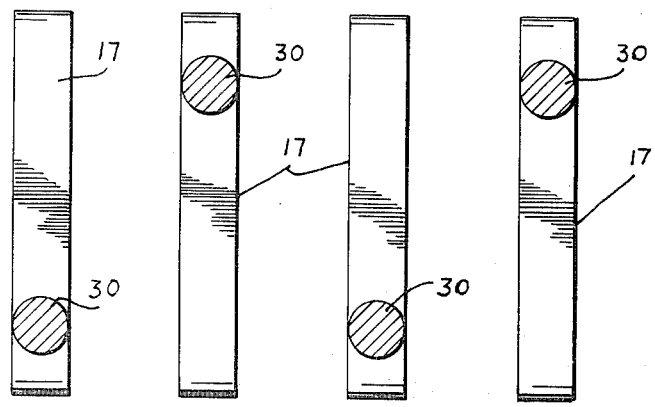
FIG. 2 is a plan view of an array of spaced terminals and of test probes in accordance with this invention being spaced apart and staggered along the lengths of the terminals.

In order to test the cord 13 for electrical characteristics, a plurality of test probes 30—30 (see FIGS. 1 and 2) must be brought into engagement with the terminals 17—17. It should be understood that while four terminals 17—17 are shown for example in FIG. 2, more than that number could be used for any one particular kind of plug and tested in accordance with the principles of this invention, provided the terminals are disposed in an ordered array. As shown in FIG. 2, the terminals 17—17 are held within the housing 11 in a spaced array and the test probes 30—30 are spaced apart at the same center-to-center distance, but are staggered along the lengths of the terminals. In this way, the high voltage breakdown path between adjacent ones of the test probes 30—30 is lengthened, thereby decreasing substantially any tendency for an arcing over between adjacent ones of the test probes and thereby avoiding erroneous test results.

Figure 3:
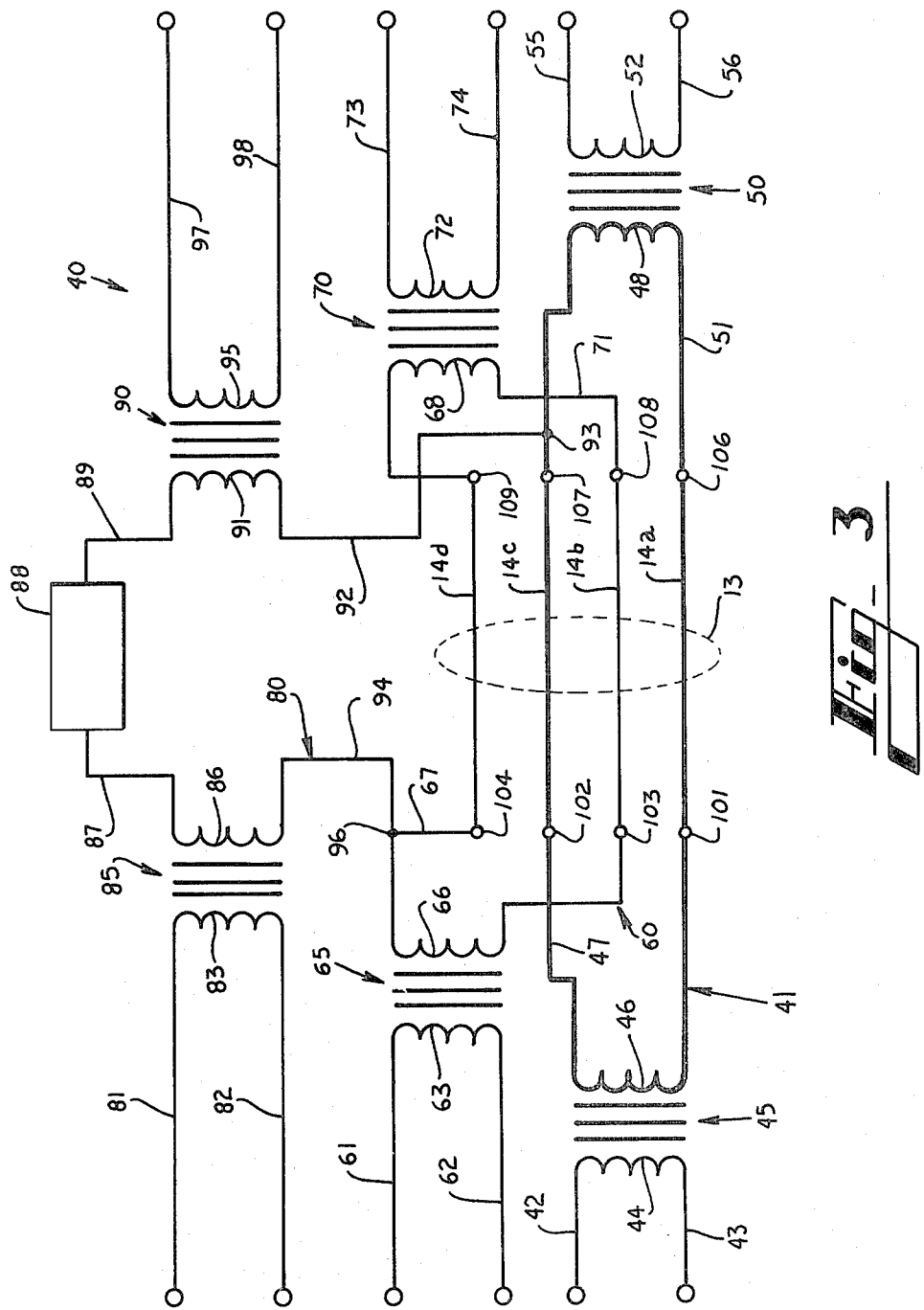
FIG. 3 is an electrical schematic view of a circuit which incorporates the principles of this invention for the testing of continuity and high voltage breakdown characteristics of modular plugs.

FIG. 3 is a schematic view of an A.C. electrical circuit, designated generally by the numeral 40, which is used to test the continuity and high voltage breakdown of the cord 13 terminated with modular plugs 10—10. The electrical circuit 40 shown in FIG. 3 includes a first series loop, designated generally by the numeral 41, which includes two leads 42 and 43 that are connected to a primary winding 44 of a commercially available constant step-down voltage transformer 45. The transformer 45 of the first loop 40 has a nominal input of 110 volts at the primary winding 44 and an output of 26 volts in a secondary winding 46 which is connected along a line 47 through a cord conductor 14c to one end of a primary winding 48 of a voltage step-up transformer 50 with the other end of the winding thereof being connected along a lead 51 back along a cord conductor 14a to the secondary winding of the transformer 45. It should be observed that the cord conductors 14a and 14c which form a portion of the loop 41 are alternate conductors. The transformer 50 is identical to the transformer 45, and if the series loop 41 is continuous, a 110 volt potential exists across a secondary winding 52 of the transformer 50 which is connected along leads 55 and 56 to an input of an associated test indicator (not shown). It should be clear that the loop 41 is isolated electrically from the input leads 42 and 43 and from the output test indicator (not shown).

The electrical circuit 40 also includes a second series loop, designated generally by the numeral 60, which includes two leads 61 and 62 that are connected to a primary winding 63 of a step-down voltage transformer 65. A secondary winding 66 of the transformer 65 is connected along a lead 67 through a cord conductor 14d to a primary winding 68 of a voltage step-up transformer 70, with a lead 71 being connected back along to the other side of the loop through a cord conductor 14b to the primary winding of the transformer 70. As in the first loop 41, it should be observed that the second loop includes cord conductors 14b and 14d that alternate with the cord conductors 14a and 14c in the loop 41. A secondary winding 72 of the transformer 70 of the second loop 60 is connected along two leads 73 and 74 to an input of an associated test indicator (not shown). The transformers 65 and 70 are identical to the transformers 45 and 50, respectively, so that 110 volts impressed across the leads 73 and 74. As can be seen from FIG. 3, the loop 60 is not only isolated electrically from its input leads 61 and 62 and its output test indicator (not shown), but is also isolated from the loop 41.

Finally, the electrical circuit 40 includes another portion, designated generally by the numeral 80, which includes two leads 81 and 82 that are connected from a 110 volt source (not shown) to a primary winding 83 of a voltage step-up transformer 85. A secondary winding 86 of the transformer 85 is at a potential of 1000 volts and is connected along a line 87 through an adjustable current limiting resistor 88 along a lead 89 to a primary winding 91 of a step-up transformer 90. The resistor 88 limits the current in the portion 80 to prevent damage in the event of a short between conductors 14—14 of the cord 13. In a preferred embodiment for the 1000 volt breakdown testing of cords 13—13 terminated with modular plugs 10—10, the resistor 88 has a value of about 400 kilohms. The other side of the winding 91 is connected along a lead 92 to the lead 47 of the first loop 40 at a junction point 93. The other side of the 1000 volt secondary winding 86 of the transformer 85 is connected along a lead 94 to the second loop 60 at a junction point 96 while a secondary winding 95 of the transformer 91 is connected through leads 97 and 98 to a breakdown detector (not shown).

The conductors 14a and 14c are connected into the loop 41 by test probes 30—30 which engage terminals 17—17 at one end of a cord 13 and which are connected to the loop 41 at junction points 101 and 102 and at the opposite end of the loop at junction points 106 and 107. The terminals 17—17 of the modular plug 10 associated with the conductors 14b and 14d are engaged by test probes 30—30 which are connected to the loop 60 at junction points 103 and 104 and at the opposite end of the loop at junction points 108 and 109.

The circuit 40 is such that the ratio of the breakdown test voltage to the continuity test voltage must be at least 50 to 1 so as not to interfere with the isolation characteristics of the portions of the circuit 40. The simultaneous testing for continuity through the loops 41 and 60 does not interfere with the high voltage testing since breakdown test voltage may vary between 1000±26 volts. Moreover, the series impedance of the windings 86 and 91 together with that of the current limiting resistor 88 is so high such as, for example, 2.4 megohms that the continuity and short detector system will not detect currents that flow therethrough and which may be on the order of magnitude of microamps. As a result, the portion 80 of the circuit is isolated from the series loops 41 and 60.

While the loops 41 and 60 have been designated the first and second loops respectively, it should be apparent that the loop 60 could be called the first loop and the loop 41 could be called the second loop without affecting the operation of the circuit 40.

Viewing now FIGS. 4 and 5, there is shown an apparatus, designated generally by the numeral 120, which embodies the principles of this invention and which is used to hold the plugs 10—10 of each terminated cord 13 to be tested and to cause the test probes 30—30 for testing continuity and high voltage breakdown to engage the terminals 17—17 of plugs 10—10 of each cord in a production environment. The apparatus 120 includes a turntable 121 which includes nests 122—122 for holding ones of the plugs 10—10. It should be noted that FIG. 4 shows one half of the apparatus 120 used for testing a cord 13. The plug 10 at one end of the cord 13 is received in the nest 122 shown in FIG. 4 while the plug at the other end of the cord is received in the nest of an identical half of the apparatus 120 which is not shown.

The apparatus 120 includes a pair of block assemblies each designated generally by the numeral 125 for simultaneously engaging probes with the terminals 17—17 of plugs 10—10 at each end of a cord 13 positioned on the turntable 121. The block assemblies 125—125 are mounted on a plate 126 beneath the turntable which includes frames 127—127 (only one of which is shown in FIG. 4). Within each frame 127, there is mounted a first block 128 made of a plastic material and having spaced rods 129—129 extending toward the turntable and through bores (not shown) in a second block 132. Each of the rods 129—129 is terminated with a cap 133. The second block 132 is mounted for sliding movement on the spaced rods 129—129 and is biased out of engagement with the first block 128 by springs 134—134 which are concentrically disposed about rods 136—136 that extend into the second block. The test probes 30—30 which are included in the test circuit 40 are mounted within the block 128 and extend through passageways 137—137 in the second block 132.

At one of the stations through which the turntable 121 is indexed, the apparatus 120 is controlled to move the plate 126 upwardly to cause each moveable block 132 to engage the plug 10 in the associated nest (see FIG. 6) whereupon the movement of the second block 132 is arrested. It should be observed that in FIG. 6, the plug 10 and the probes 30—30 are shown in an inverted position from that in FIGS. 4 and 5. The first block 128 continues its motion, compressing the springs 134—134 between the two blocks, and causing the test probes 30—30 to be moved upwardly into engagement with the associated ones of the terminal blades 17—17.

Advantageously, the upper portion of the second block 132 spans across the partitions of fins 21—21 of the plug 10 (see FIG. 6) which together with the staggered arrangement of the probes 30—30 prevents inadvertent breakdown between the probes when the cord 13 is subjected to a relatively high voltage. As can be seen, the test probes 30—30 are designed to be moved into engagement with the terminals 17—17 at about the same time that plastic portion or insulated portion of the arresting block is moved downwardly into engagement with the outwardly facing surfaces of the fins 21—21 which comprise a portion of the compartments between adjacent ones of the terminals. This advantageously provides isolation between adjacent ones of the terminals 17—17 and together with the staggered spacing of the test probes 30—30 insures that there is no inadvertent arcing over between adjacent ones of the terminals during the high voltage breakdown test.

In operation, the circuit 40 tests for continuity by causing 110 volts to be applied across the transformer 45 of the first loop 41 which is stepped down to a low voltage of 26 volts on the secondary winding 46 and which is impressed across the alternating ones of the test probes 30—30 at junction points 101 and 102 and alternating ones of the terminals 17—17. Simultaneously, 110 volts is impressed across the primary winding 63 of the second loop input transformer 65 which is stepped down to 26 volts and which is impressed across the other alternating pair of test probes 30—30 at the junction points 103 and 104 and the remaining two terminals 17—17 of the modular plug 10. Should there be continuity through the terminals 17—17 and the conductors 14—14, the 26 volts potential will be impressed on the junction points 106-107 and across the winding 48 of the transformer 50 and 110 volts at the secondary 52 and the leads 55-56 to provide an output indication to an operator.

On the other hand, should there not be continuity along the cord 13, there is no voltage induced in the secondary winding 52 of the transformer 50 and there is no output indication of continuity along the leads 55 and 56. In that event, further testing of the modular plug 10 is suspended and the cord 13 is ejected from the apparatus 120 without the waste of time in it having been subjected to test for high voltage breakdown.

The operation of the second series loop 60 to test for continuity is similar to that described for the operation of the first series loop 41. Should continuity exist through the two conductors 14—14 that extend between the junction points 103-104 and 108-109 respectively, there will be an output indication along the leads 73 and 74. In the event that ends of the conductors 13—13 are not connected to corresponding terminals 17—17 in the plugs 10—10, zero voltage will appear across the detector transformers 50 and 70 of the low voltage loops 41 and 60, respectively.

One of the features of the inventive apparatus is the automatic testing for high voltage breakdown between the terminals 17—17 in the event the cord 13 passes its continuity test. In the testing for high voltage breakdown, 110 volts is impressed across the primary winding 83 (see FIG. 3) of the transformer 85 and stepped up to 1000 volts. The current is applied along the lead 94 through the junction point 96 and the secondary winding 66 of the transformer 65 to the junction points 104 and 103. The current in the portion 80 is also applied through the current limiting resistor 88, along the lead 89, through the primary winding 91 of the transformer 90 and along the lead 92 to the junction point 93. If there is a high voltage breakdown between adjacent ones of the terminals 17—17 at the junction points 102 and 104 or between the junction point 103 and 102 or 101 when the 110 volts is applied across the transformer 85 and stepped up to 1000 volts, there will be a breakdown between isolated transformer loops 41 and 60 which are connected to alternating ones of the terminals. Such a breakdown causes a completion of a loop which includes the portion 80 and a current of about 1.2 milliamps along the line 92 through the primary winding 91 of the transformer 90 to provide a nominal output of 110 volts on the secondary winding 95 and along the lines 97 and 98 to the associated breakdown detector (not shown). If there is no high voltage breakdown between adjacent ones of the terminals 17—17, then there is no output on the winding 95 of the transformer 90 which is indicative that the modular plug 10 under test is acceptable.

After the test is completed the lower block 128 is moved downwardly permitting the springs 134—134 to expand and to withdraw the probes 30—30 from engagement with the terminals 17—17. After a predetermined amount of movement, the upper block 132 is moved out in engagement with the fins 21—21 of the housing 11 of the plug 10.

The mounting of the probes 30—30 to extend from the first block 128 through close-fitting bores 137—137 in the extension of the second block 134 provides the capability of wiping the probes as they are retracted from engagement with the terminals. Advantageously, this removes any slivers of metal which may have remained with the terminals 17—17 as a result of forming and which may cling to the probes.

In an alternate embodiment which includes the principles of this invention, FIGS. 7 through 8 show an apparatus, designated generally by the numeral 150, which includes a conveyor 151 having a plurality of nests 152—152 for holding ones of the modular plugs 10—10. The test apparatus 150 includes a base 153 having a column support pedestal (not shown) for mounting pivotally an arm 156. One end of the arm 156 is moved by a rod and a cylinder arrangement. Another end 159 of the arm 156 is connected to a carriage 161 that is mounted slidably along rods 162—162 between an upper unoperated position and a lower test position.

The carriage 161 has a plurality of projecting rods 163—163 for supporting a plate 164 having an L-shaped portion 165. The plate 164 has mounted thereon a block assembly 165 which includes an upper block 167 attached thereto and having a pair of rods 168—168 extending downwardly through bores (not shown) in a lower block 171 and terminating in caps 172—172. The lower block 171 in an unoperated condition is spaced from the upper block 167 by compression springs 173—173 which are concentrically disposed about the rods 168—168. The test probes 30—30 extend from the upper block 167 to which they are connected to the electrical circuit 40 downwardly through the lower block 171 to be brought into engagement with the terminals 17—17 of the plugs 10—10 in the nests on the conveyor.

At a test station, the conveyor 151 is discontinued from its indexing movement and the apparatus 150 is operated which causes the arm 156 to rotate clockwise as shown in FIG. 7 to cause the carriage 161 to be moved downwardly. As this occurs the lower one of the blocks 171 moved downwardly to engage the L-shaped portion 165 (see FIG. 8) whereupon the upper block 167 continues to move against the compression action of the springs 173—173 until the probes 30—30 engage ones of the terminal 17—17 within the nest in the test position.

The features of the engagement of the lower block 171 with the plug housing 11 to span across the partitions between the terminals 17—17 and the wiping of the probes 30—30 upon withdrawal are present in this embodiment as well as is that shown in FIGS. 4 and 5.

It should be obvious that while an electrical cable or cord 13 under test in not limited to four conductors 14—14, there is a requirement that it have an ordered array of terminals or contact points to be engaged by the probes 30—30. In other words, the test circuit 40 is not adaptable to the testing of a prior style circular cross-sectional telephone cord having the conductors terminated, for example, by spade tips which would be arranged in random fashion. However, that same prior style cord is testable with the methods and apparatus of this invention if the cord is terminated by a modular plug such as that disclosed in E. C. Hardesty U.S. Pat. No. 4,054,350 which converts a misordered plurality of conductors to an ordered array of terminals 17—17 at each end of the cord.

It is however, extremely adaptable to the testing of so-called flat telephone cords which are in widespread use today as well as a testing of even a greater number of conductors such as one might encounter, for example, in ribbon or under-the-floor or flat type cable. In those instances, rather than two pairs of isolated transformer loops 41 and 60 being used, a test circuit 200 is arranged to include n pairs of loops (see FIG. 9A) with each loop in each pair being connected to two alternating ones of an ordered array of conductors. In this way, the principles of this invention may be extended to provide an indication on the output side of the transformer 90 should there be a breakdown between adjacent ones of the conductors caused by the impression of a relatively high voltage therebetween.

Figure 9B:
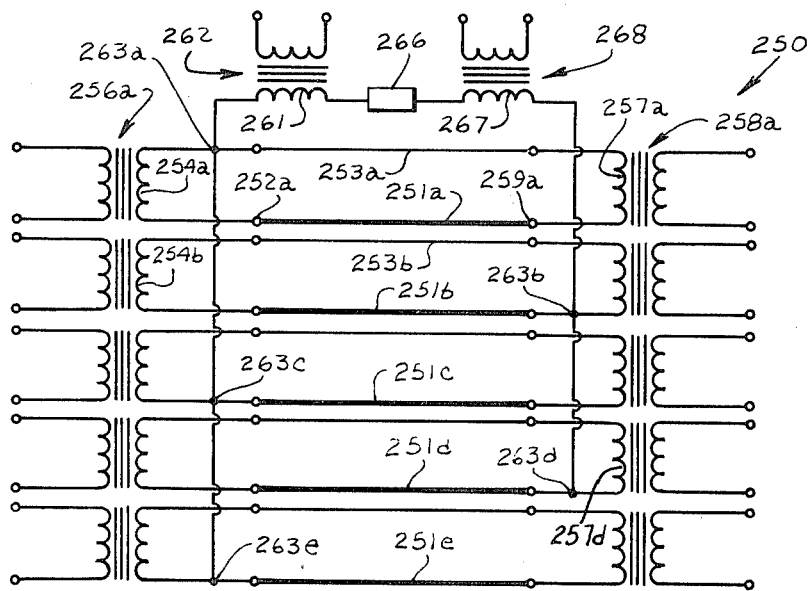
FIGS. 9A and 9B are schematic views of apparatus which embody the principles of this invention for testing multiconductor arrangements other than telephone cords.
Figure 9A:
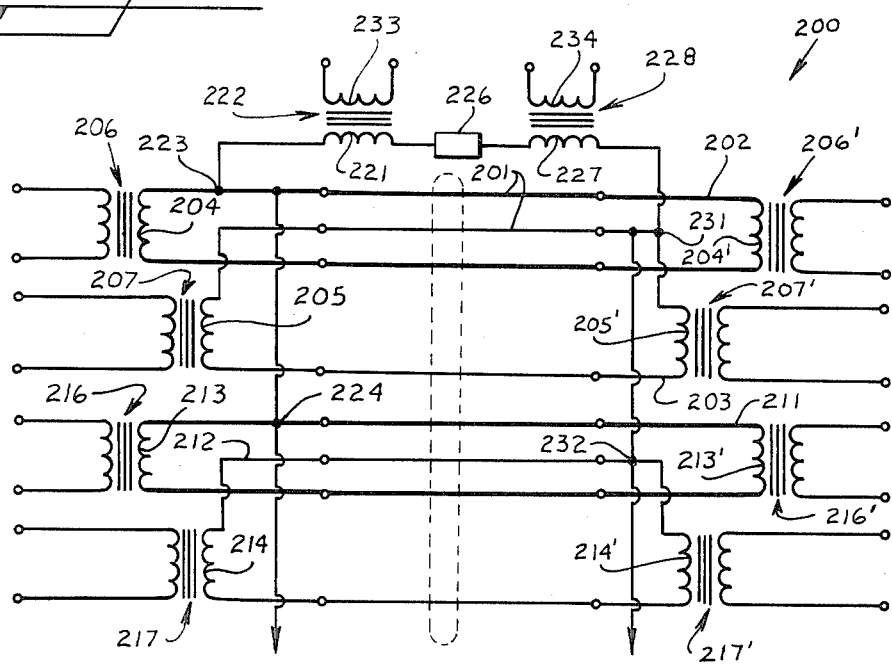

In the circuit 200 shown in FIG. 9A, for testing conductors 201—201, a first pair $n_1$ of loops includes a first series loop 202 and a second series loop 203 which are connected to windings 204-204' and 205-205' of transformer 206-206' and 207-207' respectively. The next pair $n_2$ of loops for testing the next four conductors 201—201 includes a first loop 211 and a second loop 212 which are connected to secondary windings 213-213' and 214-214' of transformers 216-216' and 217-217' respectively.

The testing of the conductors 201—201 for high voltage breakdown in accordance with the principles of this invention is accomplished by connecting one side of a secondary winding 221 of an input transformer 222 to each of the first loops such as at junction points 223 and 224 and the other side of the winding 221 through a current limiting resistor 226 through a secondary winding 227 of an output transformer 228 and to each of the second loops of each pair n at junction points 231 and 232. A potential of 110 volts across a primary 233 of the transformer 222 is stepped up to 1000 volts across the secondary winding 221 and between junction points 223 and 231 of the first and second loops 202 and 203, respectively, of group $n_1$ and between junction points 224 and 232 of the first and second loops 211 and 212, respectively of group $n_2$. Any breakdown between adjacent conductors of different loops in a gauge causes an output in a winding 234 of the transformer 228.

The principles of this invention may also be used to detect breakdown when adjacent conductors of a plurality are subjected to a predetermined potential difference. For example, viewing FIG. 9B, there is shown a circuit arrangement, designated generally by the numeral 250, for testing breakdown between adjacent ones of a plurality of conductors 251a-251e. First ends 252a-252e of the conductors 251a-251e, respectively, are connected in series loops 253a-253e, respectively, through windings 254a-254e of transformers 256a-256e and through windings 257a-257e of transformers 258a-258e to opposite ends 259a-259e of the conductors. One end of a secondary winding 261 of an input transformer 262 is connected to alternate ones of the series loops 253a-253e at junction points 263a, 263c and 263e while the other end of the secondary winding 261 is connected through a current limiting resistor 266 and through a primary winding 267 of a detector transformer 268 to ones of the loops 253 which are interposed between the loops 253a, 253c and 253e at junction points 263b and 263d.

Should a breakdown occur between any adjacent ones of the conductors 251a-251e when a test voltage is impressed between junction points 263a, 263c, 263e and junction points 263b and 263d, an output is produced in the detector transformer 268 which indicates a test voltage breakdown.

It is to be understood that the above-described arrangements are simply illustrative of the invention. Other arrangements may be devised by those skilled in the art which will embody the principles of this invention and fall within the spirit and scope thereof.

What is claimed is:

1. A method of testing electrical characteristics of a cable having a plurality of conductors, said method comprising the steps of:
   establishing a first series loop to include one of said conductors;
   establishing a second series loop which is isolated from said first loop to include another one of said conductors which is adjacent said one conductor that is included in said first loop;
   connecting one side of a test voltage source transformer to the first loop and the other side of said test voltage source transformer to a detector transformer and then to said second series loop; and
   causing a test voltage to be impressed across the source transformer and between the conductor in said first loop and the conductor in said second loop with test voltage breakdown between adjacent conductors in the first and second loops causing current to flow through the detector transformer to provide an output reading which is indicative of a breakdown between said adjacent conductors.

2. The method of claim 1, wherein each of alternating ones of the plurality of conductors is included in a separate series loop, each of said separate series loops being connected to said one side of said test voltage source transformer and wherein each of said remaining conductors of said plurality of conductors is included in a separate series loop with each of said series loops which include said remaining conductors being connected to the other side of said test voltage source transformer.

3. The method of claim 1, which also includes the step of connecting each of said first and second loops across an associated input transformer and across an output detector transformer to facilitate the testing of said isolated loops for continuity simultaneously with the testing for breakdown between said loops.

4. A method of testing electrical characteristics of a cable having a group of four conductors which are disposed in a linear array, said method comprising the steps of:
   establishing a first series loop between two alternate ones of said conductors;
   establishing a second series loop, which is associated with and isolated from the first loop, between two conductors which are alternately disposed with respect to the conductors which are connected to the first loop;
   connecting one side of a test voltage source transformer to said first loop and the other side of said test voltage source transformer to a detector transformer and then to said second series loop; and
   causing a test voltage to be impressed across the source transformer and across the conductors in said first and second loops with test voltage breakdown between adjacent ones of the conductors in the associated first and second loops causing current to flow in said second loop through the detector transformer to provide an output reading which is indicative of a breakdown.

5. The method of claim 4, which also includes the step of connecting each of said first and second loops across an associated input transformer and across an output detector transformer to facilitate the testing of said isolated loops for continuity simultaneously with the testing for breakdown between said loops.

6. The method of claim 5, which further includes the step of providing a current path from said first series loop through said detector transformer to said second series loop which has sufficient impedance to effectively isolate said first and second loops from each other.

7. The method of claim 4, wherein the conductors are terminated at each end with terminals which are disposed in an ordered array.

8. The method of claim 7, wherein the steps of establishing the first and the second series loops includes the steps of moving test probes into engagement with the terminals, alternate ones of said test probes being staggered along the lengths of the adjacent terminals.

9. The method of claim 8, wherein said terminals are mounted in a housing made of a dielectric material, and said probes are mounted for movement along axes of the probes, and prior to movement of the probes into engagement with the terminals, a block is moved into engagement with portions of the plug to enclose the exposed contact edges of the terminals.

10. The method of claim 9 wherein subsequent to the testing of the terminals, the probes are withdrawn from engagement with the terminals and are subjected to a wiping action.

11. An apparatus for testing electrical characteristics of a cable having a plurality of conductors, said apparatus comprising:
means for establishing a first series loop which includes one of said conductors;
means for establishing a second series loop which is isolated from said first loop and which includes another one of said conductors that is adjacent said one conductor included in said first loop;
a test voltage source transformer;
a detector transformer;
means for connecting one side of said test voltage source transformer to the first loop and the other side of said test voltage source transformer to said detector transformer and then to said second series loop; and
means for causing a test voltage to be impressed across the source transformer and between the conductor in said first loop and the conductor in the second loop with test voltage breakdown between the adjacent conductors in the first and second loops causing current to flow through the detector transformer to provide an output reading which is indicative of a breakdown.

12. The apparatus of claim 11, wherein each of alternating ones of the plurality of conductors is included in a separate series loop, each of said separate series loops being connected to said one side of said test voltage sources transformer, and wherein each of said remaining conductors of said plurality of conductors is inlcuded in a separate series loop with each of said series loops which include said remaining conductors being connected to the other side of said test voltage source transformer.

13. The apparatus of claim 11, which also includes means for connecting each of said first and second loops across an associated input transformer and across an output detector transformer to facilitate the testing of said isolated loops for continuity simultaneously with the testing for breakdown between said loops.

14. An apparatus for testing electrical characteristics of a cable having at least one group of four conductors disposed in a linear array, said apparatus comprising:
an input transformer associated with each two alternating conductors of each group;
a detector output transformer associated with each two alternate ones of said group;
means for establishing a first series loop between two alternating ones of said conductors, the secondary winding of said input transformer and the primary winding of said output transformer;
means for establishing a second series loop between the remaining two conductors of said group which are alternately disposed with respect to those of the first loop;
a test voltage source;
a breakdown detector transformer;
means connecting one side of the test voltage source to the input transformer;
means for connecting the secondary of the input transformer to the first loop and the other side of said test voltage source transformer to the breakdown detector transformer and then to said second series loop; and
means causing a test voltage to be impressed across the source transformer and across the conductors in said first loop with test voltage breakdown between adjacent ones of the conductors in the first and second loops causing current to flow in the second loop through the breakdown detector transformer to provide an output reading which is indicative of a breakdown.

15. The apparatus of claim 14, which further includes means having sufficient impedance to effectively isolate said first and second loops from each other for providing a current path from said first series loop through said breakdown detector transformer to said second series loop.

16. The apparatus of claim 14, wherein each of the conductors is terminated at each end with a terminal and the means for establishing the first and the second loops each includes a plurality of test probes and said apparatus further includes:
means for mounting the test probes to be moved into and out of engagement with the terminals; and
means effective as the test probes are moved out of engagement with the terminals for wiping the test probes to remove extraneous matter.

* * * * *